United States Patent [19]
Hutkin

[11] 4,061,837
[45] Dec. 6, 1977

[54] PLASTIC-METAL COMPOSITE AND METHOD OF MAKING THE SAME

[76] Inventor: Irving J. Hutkin, 5284 Stonecourt, San Diego, Calif. 92115

[21] Appl. No.: 697,204

[22] Filed: June 17, 1976

[51] Int. Cl.$^2$ .................... B32B 15/08; B32B 15/20
[52] U.S. Cl. .................................. 428/609; 156/151; 428/626; 428/657; 428/674
[58] Field of Search .................. 29/195 P; 156/151; 428/609, 657, 674, 626

[56]  References Cited
U.S. PATENT DOCUMENTS

| | | | |
|---|---|---|---|
| 2,802,897 | 8/1957 | Hurd et al. | 29/195 X |
| 3,220,897 | 11/1965 | Conley et al. | 156/151 X |
| 3,293,109 | 12/1966 | Luce et al. | 156/150 X |
| 3,328,275 | 6/1967 | Waterbury | 156/151 X |
| 3,585,010 | 6/1971 | Luce et al. | 29/195 X |
| 3,857,681 | 12/1974 | Yates et al. | 29/195 |
| 3,918,926 | 11/1975 | Wolski et al. | 29/195 |
| 3,958,317 | 5/1976 | Peart et al. | 29/195 |
| 3,981,691 | 9/1976 | Cuneo | 29/195 |

Primary Examiner—Arthur J. Steiner
Attorney, Agent, or Firm—John J. Posta, Jr.

[57] ABSTRACT

The improved plastic-metal unitary composite of the invention formed by the present method, includes (a) a thin copper foil, for example, weighing about 1 or 2 ounces per square foot, one side of which has a rough irregular surface with improved bondability to plastic but increased propensity for staining, (b) a thin layer of metal selected from Cr, Al, Cd or a Cd alloy of Sn, Zn or Cu, or a mixture thereof, encapsulating the rough surface so as to decrease its staining characteristic without substantially descreasing its bondability, and (c) a plastic substrate bonded to the encapsulating layer. The rough irregular surface of the foil includes a plurality of discrete particles of copper and/or copper oxide adherent to the copper foil but detachable therefrom and embeddable in the plastic.

However, the encapsulating metal layer, substantially reduces such detachment and embedding and thus substantially reduces, as noted above, undesirable staining which commonly occurs during utilization of such composites in the manufacture of such items as printed circuit boards and the like. These advantages are achieved while reducing the tendency of fine lines of copper conductor made therefrom on the circuit boards to lift from the substrate. Processing of the boards is facilitated, since standard etching solutions can be employed.

8 Claims, No Drawings

PLASTIC-METAL COMPOSITE AND METHOD OF MAKING THE SAME

BACKGROUND

1. Field of the Invention

The present invention generally relates to composites and more particularly to composites of thin copper foil and plastic, which composites are useful in the manufacture of electrical and electronic components and the like.

2. Prior Art

Copper foil that has been laminated to plastics is commonly used in the manufacture of printed circuit boards. These boards are employed in a wide variety of commercial electronic applications such as in television sets, radios, computers, and automobile dashboards. In such applications it has been unnecessary to design printed circuits with conducting elements smaller than about 1/16 inch in width or with gaps between adjacent conducting elements smaller than about 1/32 inch. Such coarse dimensions have not required great precision in the preparation of the printed circuits nor much uniformity in the width of their conductors. Special extra-thin copper foil weighing ⅛ oz. to ½ oz. per sq. ft. is now made using processes that employ temporary carriers such as metal foils and plastics.

Typically, however, conventional copper foil clad laminates are made using copper foil that weighs between about ½ oz. per sq. ft. and about 2 oz. per sq. ft. and that has been formed by electrodeposition of copper onto the surface of a rotating drum. The drum surface has been pretreated so that the thus formed copper foil layer can be easily peeled away. The side of the thus formed copper foil, which is exposed, that is, is away from the drum, is much rougher than the side facing the drum and it is this rough side which is then bonded to plastic to form the typical composite or laminate referred to above.

Before the lamination step, however, the rough (matte) surface of the copper foil is usually treated to form thereon a plurality of small projections or nodules which enhance the bondability of the foil to the plastic. Thus, these nodules or projections comprise a myriad of microscopic particles of copper and/or copper oxide, some of which are only loosely adherent to the copper foil surface.

One such plastic adhesion-increasing treatment which causes formation of the nodules is described in U.S. Pat. No. 3,220,897, issued Nov. 30, 1965 to C. C. Conley. An improvement of that method is disclosed in B. Luce's U.S. Pat. No. 3,293,109, issued Dec. 20, 1966. In the latter patent, an encapsulating layer of copper is placed over and around the nodules or projections of copper-copper oxide particles (formed as by the method of U.S. Pat. No. 3,220,897) so as to lock those particles more securely to the matte surface of the copper foil.

Although both of the described patented methods are still used to manufacture copper foil for printed circuit laminates, problems are encountered as a result of their use. Thus, when the treated copper foil surface is brought into contact with the uncured plastic under high heat and high pressure during the lamination step, the copper or copper oxide particles tend to be broken away from the copper foil surface and to become embedded below the plastic surface. When the copper is then etched away, as during the preparation of the printed circuit, there remains behind a discoloration of the plastic surface, which is called "staining". Such discoloration comprises a plurality of the copper and/or copper oxide particles as embedded in the plastic, and adversely affects the dielectric properties of the plastic. Thus, the over-all performance of the printed circuit is impaired as well as its physical appearance.

More recent applications of copper foil clad laminates for printed circuits have been in areas requiring miniaturization of the printed circuits. New electronic components such as light emitting diodes and miniature assemblies of semiconductors, such as integrated circuits, have created more severe performance requirements for the manufacturers of printed circuits. Printed circuits with conducting elements having a width of only a few thousandths of an inch and spacings between elements of similar dimensions, have become common and have shown up the deficiencies of the ordinary copper foil adhesion-increasing treatments.

In order to insure that a copper conducting element of only a few mils width remains firmly attached to the plastic substrate during the fabrication of the printed circuit, the described adhesion-increasing treatment must be extensive and it must also be uniform. Despite such precautions, more numerous occurrences of "staining" or "brown spotting" usually are experienced as copper conductor widths are reduced. Moreover, an additional difficulty arises in the form of a phenomenon called "line lifting", where the conducting elements tend to separate over small areas from the plastic substrate. Examination of the separated areas under the lifted conducting elements often shows that the particular area of copper surface so affected has not been sufficiently nodularized.

An improvement in the treatment of copper foil surfaces to enhance bonding and reduce "staining" has been described by Luce in U.S. Pat. No. 3,585,010 issued June 15, 1971. In that patent, the encapsulating copper layer called for in U.S. Pat. No. 3,293,109 is replaced by a layer of one of a selected few other metals, namely, indium, nickel, tin, cobalt, bronze, zinc or brass. The layer is electroplated over the copper-copper oxide particles on the treated foil surface to form an encapsulating barrier layer. Some reduction in "staining" is often noted when this method is employed.

However, because of the substantial differences in the chemical characteristics of the metals indium, zinc and brass, from those of the copper over which they are deposited, certain other substantial problems are introduced when this method is used.

The zinc, whether present in the form of the pure metal or as the alloy brass, is highly soluble in conventional ferric chloride and copper chloride etching solutions used in the manufacture of the circuit boards, and, thus, is attacked much more rapidly during etching than is the copper. Therefore, when the excess copper being etched away to form the conducting elements, the zinc-rich layer that encapsulates the copper-copper oxide particles is exposed to the chloride etching solution and is stripped away quite rapidly. Since this encapsulating layer is at the bonding interface between the copper foil and the plastic, its more rapid attack results in undercutting of the conducting element.

If the conducting element is narrow, such as in the more recent circuit designs, then rapid etching of the small zinc-rich bonding interface severely reduces the bond between the copper conducting element and the plastic. This often results in low peel strength and/or line lifting. This susceptibility of the zinc to the chloride type etchants is well known and it is for this reason that zinc or brass (encapsulated) treated copper foil is not often used for fine line circuits that are to be etched in chlorides. Moreover, copper foil with such zinc-rich layer on its bonding surface requires special handling to prevent its dezincification, which can result even from casual contact with fingerprints.

The other metals listed in the Luce patent, have even greater drawbacks as stain resistant barrier layers. Indium, cobalt, and nickel, for example, have etching characteristics that are markedly different than copper and if used commercially they would require specialized etching procedures of two or more steps and different solutions to remove the composite metals.

Accordingly, there is a need for an improved copper foil for use in printed circuit laminate manufacture, which foil readily adheres to but reduces both staining of the plastic substrate and fine line lifting of copper conductor (made from the foil) from the substrate during such manufacture. There is also a need for an improved laminate of copper foil and plastic substrate having such properties and which can be processed into printed circuits without having to resort to special etching solutions.

SUMMARY OF THE INVENTION

The foregoing needs have been satisfied by the improved composite of the invention and the improved method of making the same. The composite and method are substantially as set forth above. Such composite has substantially reduced staining and fine line lifting characteristics and yet can be processed into printed circuitry utilizing standard cleaning and etching solutions. Moreover, the present method results in increased adhesion between the copper foil and substrate through the action of the novel encapsulating layer and thus assures unitary integrity throughout processing. The method is simple, direct, inexpensive and highly efficient, employing a controlled thin layer of metal selected from chromium, aluminum, cadmium or an alloy of cadmium with tin, zinc or copper, or a mixture thereof, to encapsulate the area of copper foil which has a rough irregular surface, due to the formation thereon of nodules or projections comprising particles of copper and/or copper oxide thereon. The increased bondability of the foil to the plastic substrate is preserved while the tendency of the described particles to separate from the foil and become embedded in the plastic is greatly suppressed.

Unlike other encapsulating techniques, the composite produced by the present method can be cleaned and etched, during fabrication of printed circuits therefrom, using standard single step solutions and procedures. Further advantages are set forth in the following detailed description.

DETAILED DESCRIPTION

The present improved method of making a plastic-metal composite having reduced staining and line characteristics and useful for printed circuit manufacture comprises as a first step, forming a copper foil having a rough irregular surface which exhibits improved bondability to plastic but also a substantial staining characteristic. The copper foil can be formed in any suitable manner, as by rolling or the like. However, as previously described, electrodeposition or electroplating of copper on the surface of a specially treated drum is the conventional well-known way of forming such foil, at about ½-2 oz. per sq. ft. such as is utilized in the usual preparation of laminates for the manufacture of standard printed circuitry and the like. Ultra-thin foil that is electrodeposited on temporary carriers such as heavier metal foils or plastic films can also be used with the method taught herein, and such foil will be from ⅛ oz. per sq. ft. to ½ oz. per sq. ft.

Modification of the foil to increase the bondability of the side thereof which is initially exposed, that is, away from the drum (or carrier) is also contemplated in accordance with the present method and can be carried out in any suitable manner. For example, one such conventional foil modifying technique often referred to as "treatment" is described in U.S. Pat. No. 3,220,897 to Conley, referred to above, wherein projections or nodules are produced on the already rough or exposed side of the copper foil by exposing it as a cathode to a current density of from 60 a.s.f. to 125 a.s.f. for about 10–60 seconds in an aqueous acidic copper sulfate bath containing 15–40 p.p.m. of halogen ion and 0.2–1 grams per liter of water-dispersible proteinaceous material. The net result is substantially increased bondability of that side of the foil due to the formation thereon of the described nodules or projections comprising copper-copper oxide particles, but at the expense of a substantial staining characteristic. Other comparable adhesion-increasing techniques can be employed.

In any event, the first step of the present method contemplates formation of the copper foil, by one or more conventional techniques, such as those described above, so that the foil has the desired bondability to plastic, but unfortunately also the undesired staining characteristic.

The second step of the present method involves greatly reducing the described staining characteristic while avoiding the introduction of undesired side effects, including those produced by the application of prior art techniques, namely, fine line lifting and inability of the plastic foil composite to be satisfactorily etched by standard etching solutions in standard single step etching modes.

In this regard, the second step of the present method comprises encapsulating the nodule-bearing or otherwise rough, irregular, plastic bondable surface of the copper foil in a thin layer of metal selected from the group consisting of chromium, aluminum, cadmium, or cadmium alloy of either tin or of zinc or of copper, or a mixture thereof, without substantially depreciating the bondability of that surface. The layer of metal preferably is between about 5 and about 80 microinches thick and, most preferably, for most purposes, about 15 to about 35 microinches. Of course, the most desired thickness will vary, depending on the particular metal(s) or alloy(s) employed in the layer, and the extent of the nodularization of the surface.

Thus, to achieve the full benefits described for this invention utilizing cadmium as the metal, there should be at least about 5 microinches of cadmium encapsulating the nodularized surface of the copper foil. Because the nodularized surface is irregular, direct measurement of thickness is difficult. Thickness is best measured by a weight difference determination. With less than the recommended about 5 microinches of cadmium, some improvement in stain resistance and peel strength will be achieved but the improvements will not be maximized, in fact, will generally be relatively small.

Not all nodularization (oxide) treatments are the same, and some may produce oxides that are more loosely adhering than others. Therefore, the amount of cadmium to properly encapsulate the particular oxide treatment should be empirically determined for each treatment process. It has generally been found, however, that encapsulation with more than about 80 microinches of cadmium offers little or no additional stain resistance or improved bonding properties. For most properly applied oxide treatments, an encapsulating cadmium layer of about 25 microinches in thickness is preferred. The cadmium layer so applied suitably encapsulates and locks the nodules securely to the copper foil surface and insulates the plastic resin from the copper.

The encapsulating procedure of the second step is preferably carried out utilizing a standard electroplating technique. However, other conventional techniques such as vacuum evaporation, ion plating, thermal decomposition of metal compounds and the like well known in the metal deposition art are also suitable for use in applying the encapsulating barrier layer of metal in the second step of the method. It will be noted, however, that aluminum must be electro-deposited from non-aqueous solutions or applied to the copper foil by evaporation techniques. Chromium can be deposited by electroplating from well known solutions.

It has been determined that the desired improved bonding characteristics can readily be achieved by depositing thereon the thin layer of the selected metal, preferably of cadmium or cadmium-copper alloy. The copper foil preferably has the described nodular copper-copper oxide projections when encapsulated in the cadmium or cadmium-copper alloy or other of the selected metals.

The etching speed and behavior of cadmium and cadmium-copper alloys is remarkably similar to pure copper in all of the commonly used printed circuit etchants. Cadmium, therefore, provides excellent resistance to staining or brown spotting and its presence on the copper foil does not require special handling.

There is also a discernible improvement in the peel strength between the cadmium encapsulated copper and at least one type of epoxy plastic substrate, over similarly oxide-treated copper foils not having the cadmium encapsulation. Although the mechanism for this is not understood, it is believed that the curing of some epoxy resins is adversely affected by contact with copper and/or copper oxide. When the cadmium encapsulating layer of this invention is interposed between the copper foil and the epoxy resin, curing of the resin proceeds in a way which yields improved bonding results, as evidenced by peel strength increases of up to 20 percent. Because of this phenomenon, it has also been found useful to employ the cadmium layer directly over the rough surface of the copper foil, without the use of an oxide or nodularizing treatment. The rough surface of one ounce copper foil laminated to a glass-epoxy without oxide treatment will often exhibit peel strength of 2 to 4 pounds per inch. By interposing the cadmium between copper and plastic the untreated peel strengths can be raised to a range of 5 to 6 pounds/inch, which is high enough for many applications.

Thin cadmium and cadmium-copper alloy encapsulating layers on the copper foil etch at essentially the same rate as does pure copper foil. Therefore, undercutting of narrow conducting elements, in conventional printed circuit etchants is minimal and line lifting from etch undercutting of narrow conductors is eliminated.

Although pure cadmium can be used to encapsulate the oxide, i.e., the nodules, or the otherwise roughened foil surface, the heat applied during the subsequent laminating procedure (bonding of foil to plastic substrate) may cause some codiffusion to occur at the cadmium-copper interface. This results in the formation of an alloy between the copper and cadmium which provides stronger chemical similarity in the etching characteristics.

Alternatively, cadmium already alloyed with copper and/or zinc or tin can be used as the encapsulating metal. Thus, cadmium codeposited electrochemically along with copper, zinc, and/or tin can be used in place of pure cadmium, if desired. In any event, the alloy should contain a major proportion, by weight, of cadmium. Because of thermal diffusion, the alloy content of such an encapsulating barrier layer changes less than does pure cadmium upon exposure to heat during the laminating cycle. The cadmium alloy barrier also provides improved resistance to other more severe thermal exposure such as is encountered during soldering or bonding in the multilayer assembly of circuit boards, etc.

Chromium and aluminum also are suitable as the encapsulating metal in the second step of the present method because they provide excellent resistance to staining and line lifting even when relatively severe thermal cycling is encountered during lamination, although the chemical etching characteristics of these barrier layer metals are somewhat different from those of copper in all conventional etchants.

As the third step in the present method, the encapsulating layer, now in place over the rough and irregular surface on the copper foil as a result of the second step, is bonded to the plastic substrate. Such substrate may be any suitable plastic, but usually is one of the conventional types of thermosetting epoxy resins or phenolic or phenol-nitrate resins utilized for such purposes. As a specific example, epichlorohydrin, -2,2'-di-(p-hydroxyphenyl) propylidine condensation product can be used. So also can poly (phenolform-aldehyde, vinyl butyral) resin.

Application of suitable heat and/or pressure usually sets the resin and effects the desired bonding to form the unitary foil-plastic composite. Thus, epoxy resins typically are bonded at about 200°–400° F. and at 100–1000 p.s.i. over the course of a few minutes to an hour or more. In the case of epoxy resin, a hardening agent such as selected polyamine is also used.

The substrate has a high dielectric strength and may include suitable glass fibers, glass fabric, paper fibers or the like to provide the desired physical strength. The plastic substrate may itself be, if desired, an adhesive which joins the foil to a sub-layer. Alternatively, a separate adhesive layer may perform the joining of the plastic and foil. Such adhesive could be, for example, phenol-formaldehyde condensate and butadiene-acrylonitrile-rubber with inert particles mixed therein. For most purposes, however, epoxy resins, reinforced with glass fabric, without intervening layers of adhesives, are utilized as the plastic substrate in the present method.

Once the bonding step is effected, the present method is complete and the desired unitary plastic-foil composite, having improved resistance to staining and line lifting, is obtained and is ready for use in conventional printed circuitry manufacture and the like. The following specific examples further illustrate certain features of the invention.

EXAMPLE I

Three separate sheets (A, B, and C) of copper foil are produced by conventional electrodeposition on a rotating drum. Each sheet weighs about 2 oz. per sq. ft. In a separate apparatus, the rough surface of each of these thus-produced foils is then treated to enhance bonding to plastic by exposing it to one of the following electrolytic treatments, with the rough surface contacting an electrolyte, the copper foil being the cathode and a lead plate being the anode:

| | |
|---|---|
| TREATMENT I: (Sheet A) | a. Electrolyte is mixture of: Copper Sulfate - 6 oz/gal and Sulfuric Acid - 13 oz/gal<br>b. Current Density = 125 to 175 amps per sq. ft.<br>c. Treatment Conditions: Room Temperature, No Agitation, Time - 30 seconds |
| TREATMENT II: (Sheet B) | a. Electrolyte is mixture of: Copper Cyanide - 13 oz/gal and Sodium Cyanide - 15 oz/gal<br>b. Current Density - 125 to 175 amps per sq. ft.<br>c. Treatment Conditions: Room Temperature, Mild Agitation, Time - 3 minutes |
| TREATMENT III: (Sheet C) | a. Electrolyte is mixture of: Copper Sulfamate - 6 oz/gal, Sulfamic Acid - 20 oz/gal and Sodium Dihexyl Sulfosuccinate - .03 oz/gal<br>b. Current Density = 125 to 175 amps per sq. ft.<br>c. Treatment Conditions: Room Temperature, Mild Agitation, Time - 1 minute |

The small projections formed on the rough foil surface of sheets A and C, respectively, by treatments I and III are composed of mixed copper and copper oxide, while that formed by treatment II on the rough surface of sheet B is relatively pure copper. The thus treated sheets A and B of foil are each divided into 2 sub-sheets A' and A'', B' and B'' and each of the 4 sub-sheets plus sheet C are then exposed to a separate one of the following encapsulation procedures to provide improved stain resistance and fine line lifting resistance and to enhance bonding, each procedure comprising electrolysis:

| ENCAPSULATION I: (Sheet A') | (Cadmium stain resistant barrier - SRB) Electrolyte Bath: | | |
|---|---|---|---|
| | Cadmium Fluoborate | 32 | oz/gal |
| | Ammonium Fluoborate | 8 | oz/gal |
| | Boric Acid | 3.5 | oz/gal |
| | Licorice | 0.15 | oz/gal |

The pH of the bath is maintained in the range from 3-3.5 and current density is 30 a.s.f. The temperature is held in a range from 70° F. to 90° F. and the foil sheet is plated for 30 seconds to a thickness of 30 microinches. Cast aluminum anodes are used and positioned opposite the treated foil surface in a deep rectangular tank. Cadmium fluoborate is added periodically to maintain the cadmium metal content of the bath at 12.6 oz. per gal.

| ENCAPSULATION 2: (Sheet A'') | (Cadmium SRB) Electrolyte Bath: | | |
|---|---|---|---|
| | Cadmium Oxide | 4.0 | oz/gal |
| | Sodium Cyanide | 13.0 | oz/gal |

Current density is held at 25 amps per sq. ft., and the bath temperature is held in the range of 75°-90° F. The anodes are high purity cadmium for approximately two-thirds of the anode area and insoluble steel for the remaining one-third of the anode area. The foil sheet A'' is plated for 30 seconds to 60 seconds to a thickness of 30 microinches.

| ENCAPSULATION 3: (Sheet B') | (Cadmium-Copper Alloy SRB) Electrolyte Bath: | | |
|---|---|---|---|
| | Cadmium Oxide | 5 | oz/gal |
| | Copper Cyanide | 1.0 | oz/gal |
| | Sodium Cyanide | 4.5 | oz/gal |
| | Sodium Carbonate | 2 | oz/gal |

Copper anodes are used to maintain the copper metal content of the bath while additions of cadmium oxide concentrate dissolved in sodium cyanide are made to keep the cadmium metal content uniform. Current density and bath make-up are varied to keep the alloy which is deposited whitish in color. Chemical analysis of the deposited alloy should show an alloy of about 50% cadmium—50% copper, which produces best results. The best thickness is approximately 30 microinches.

| ENCAPSULATION 4: (Sheet B'') | (Cadmium-Tin Alloy SRB) Electrolyte Bath: | | |
|---|---|---|---|
| | Potassium Stannate ($K_2Sn(OH)_6$) | 14 | oz/gal |
| | Cadmium Oxide | 1 | oz/gal |
| | Potassium Cyanide (total) | 4 | oz/gal |
| | Potassium Hydroxide | 2 | oz/gal |

This bath operates at 65° C. with a current density of 35 amps per sq. ft. Approximately 35 microinches of alloy of 50:50 is obtained in 1 minute and is maintained through control of the anode composition. Thus, the anode utilizes an alloy of the same composition (50:50). Temperature and current density are also used to control the deposition ratio. This alloy has a low melting point and is best used in applications having relatively low plastic laminating and curing temperatures.

| ENCAPSULATION 5: (Sheet C) | (Cadmium-Zinc Alloy SRB) |
|---|---|

The treated copper foil sheet C is first passed through the bath of Encapsulation I, for 20 seconds to deposit approximately 20 microinches of cadmium and is then rinsed, after which it is passed through the following bath:

| Electrolyte Bath | | |
|---|---|---|
| Zinc Chloride | 15 | oz/gal |
| Ammonium Chloride | 20 | oz/gal | at room temperature with a current density of 20 amps per sq. ft. for 15 seconds to deposit about 15 microinches of zinc thereon.

After laminating treated sheet C to a glass reinforced epoxy at about 300° F. and 200 p.s.i. for 60 minutes, examination of the SRB layer thereon shows that it comprises a 60:40 alloy of cadmium with zinc together with a small concentration (a few percent) of copper. The laminate exhibits no visible staining and, when used in the fabrication of thin line conductors in printed circuitry exhibits no tendency to delaminate (line lifting). Essentially the same results are obtained upon laminating sheets A', A'', B', and B'' to epoxy resin at 300°–400° F. and 100–500 p.s.i. and thereafter utilizing the laminate in the fabrication of printed circuit boards. Moreover, standard cleaning and etching solutions are employed on the laminates without undercutting of the conductor lines thereof during manufacture of the printed circuitry, even in instances where the conductor lines are substantially narrower than 1/100 inch. Accordingly, improved results are obtained by the present method.

EXAMPLE II

In a first test, an approximately 1 oz. per sq. ft. copper foil is formed by electrodeposition on a conventional drum by a conventional forming technique and is then divided into Samples 1, 2, and 3. Sample 1 being then treated by treatment I of Example I, Sample 2 by treatment II of Example I and Sample 3 by treatment III of Example I. Samples 1, 2 and 3 are then encapsulated by encapsulation set forth below, utilizing an electrolyte procedure:

| ENCAPSULATION 6: | (Chromium Stain Resistant Barrier) Electrolyte Bath: | |
|---|---|---|
| | Chromic Acid | 33 oz/gal |
| | Sulfuric Acid | .33 oz/gal |

The bath temperature is maintained at 75° F. with a current density of 40 amps per sq. ft. Lead or lead alloy anodes are used and immersion of the treated copper foil for 3–4 minutes produces a chromium barrier layer that is approximately 25 microinches thick. Lamination of the barrier layer (and foil) to the same type of substrate as utilized in Example I under the same laminating conditions yields the same results as obtained in Example I. All of the standard etching solutions except the chlorides have a minor effect on the SRB.

In a second test, the procedure of the first test is followed, except that aluminum is the SRB and it is applied by a conventional vacuum evaporation procedure at about 1300° F. and vacuum of 1 micron of mercury for about 5 minutes until the aluminum deposited as the encapsulating layer reaches a thickness of 15 to 25 microinches. Effective cleaning of the treated surface precedes the deposition of the aluminum in order to drive off absorbed moisture from the copper foil surface. This is carried out by heating the copper foil to about 230° F.

The aluminum SRB layer on the foil provides substantially the same results as those obtained with chromium, when the foil is laminated, as in the first test, and then made into printed circuitry.

EXAMPLE III

Treatments I and III, Example I, are applied to copper foil sheets X and Y, after which improved adhesion of the thus formed copper-copper oxide nodules produced in these treatments, is attained by subjecting sheets X and Y to a 2 minute cycle at a current density of 40 amps per sq. ft. in the same solution as that used to form the oxide (Treatments I and III). This additional step deposits pure copper over the copper-copper oxide nodules to better anchor them to the foil surface. The remainder of the procedure of Example I, Encapsulation I, is then applied to sheets X and Y with further improvements in plastic adhesion and line lifting suppression, as contrasted with Example I.

After the application of the SRB layer, the thus-treated copper foil is treated with a suitable corrosion inhibitor, namely, it is dipped in a solution of 2 grams per liter of benzotriazole in water at 150° F.

Accordingly, an improved method of encapsulating roughened, preferably nodularized copper foil surfaces to reduce staining thereof while not reducing the plastic bondability thereof is provided. The method is simple, inexpensive and direct and utilizes one or more of a selected group of metals. Line lifting is suppressed and in most instances no change whatsoever in standard cleaning and etching solutions and techniques need be made in order to successfully apply the composite product of the method in the fabricating of high quality standard and miniaturized circuitry. Various other advantages of the method and product are set forth in the foregoing.

Various changes and alterations can be made in the present method, its steps and parameters and in the present composite, its components and parameters. All such changes and alterations as are within the scope of the appended claims form part of the present invention.

What is claimed is:

1. An improved plastic-metal unitary circuit composite having reduced staining and line lifting characteristics, said composite comprising, in combination:
   a. copper foil, a side thereof having a rough irregular surface with improved bondability to plastic but substantial staining characteristics;
   b. a layer about 5 to about 80 microinches thick of metal selected from the group consisting of cadmium, cadmium alloy of tin, cadmium alloy of zinc, cadmium alloy of copper, encapsulating said rough irregular surface without substantially depreciating said bondability; and,
   c. a plastic substrate bonded to said encapsulating layer.

2. The improved composite of claim 1 wherein said rough irregular surface includes adherent nodules comprising particles of copper and/or copper oxide, wherein said reduced staining comprises a reduced tendency of said particles to become detached from said rough irregular surface and embedded in said plastic during manufacture of said circuit and wherein said reduced line lifting comprises increased resistance of fine copper lines made from said foil to separate from said substrate during fabrication of said circuit.

3. The improved composite of claim 1 wherein said layer of metal is about 15 to about 35 microinches thick.

4. The improved composite of claim 1 and wherein said copper foil weighs between about 1/8 and about 2 oz. per sq. ft.

5. An improved method of making a plastic-metal circuit composite having reduced staining and line lifting characteristics, said method comprising:
   a. forming a copper foil having a side thereof with a rough irregular surface which exhibits improved bondability to plastic but substantial staining characteristics;
   b. encapsulating said rough irregular surface with a layer about 5 to about 80 microinches thick of metal selected from the group consisting of cadmium, cadmium alloy of tin, cadmium alloy of zinc, cadmium alloy of copper, without substantially depreciating said bondability; and,
   c. bonding said encapsulating layer to a plastic substrate, whereby said composite has a reduced tendency to stain.

6. The improved method of claim 5 wherein said rough irregular surface includes nodules comprising adherent particles of copper and/or copper oxide, wherein said reducing staining comprises a reduced tendency of said particles to become detached from said rough irregular surface and embedded in said plastic during manufacture of said circuit, and wherein said reduced line lifting comprises increased resistance of fine copper lines made from said foil to separate from said substrate during fabrication of said circuit.

7. The improved method of claim 5 wherein said layer of metal is about 15 to about 35 microinches thick.

8. The improved method of claim 5 and wherein said bonding of said encapsulating layer to said plastic substrate is effected at elevated temperature or pressure.

* * * * *